US009645510B2

United States Patent
Op 'T Root et al.

(10) Patent No.: US 9,645,510 B2
(45) Date of Patent: May 9, 2017

(54) METHOD OF CONTROLLING A RADIATION SOURCE AND LITHOGRAPHIC APPARATUS COMPRISING THE RADIATION SOURCE

(71) Applicant: ASML Netherlands B.V., Veldhoven (NL)

(72) Inventors: Wilhelmus Patrick Elisabeth Maria Op 'T Root, Nederweert (NL); Adrianus Leonardus Gertrudus Bommer, Roermond (NL); Robert De Jong, Eindhoven (NL); Frank Everts, Eindhoven (NL); Herman Philip Godfried, Amsterdam (NL); Roland Pieter Stolk, Sprang-Capelle (NL); Paul Van Der Veen, Waalre (NL)

(73) Assignee: ASML NETHERLANDS B.V., Veldhoven (NL)

( * ) Notice: Subject to any disclaimer, the term of this patent is extended or adjusted under 35 U.S.C. 154(b) by 0 days.

(21) Appl. No.: 14/787,738

(22) PCT Filed: Apr. 16, 2014

(86) PCT No.: PCT/EP2014/057709
§ 371 (c)(1),
(2) Date: Oct. 28, 2015

(87) PCT Pub. No.: WO2014/187619
PCT Pub. Date: Nov. 27, 2014

(65) Prior Publication Data
US 2016/0070179 A1 Mar. 10, 2016

Related U.S. Application Data

(60) Provisional application No. 61/825,300, filed on May 20, 2013.

(51) Int. Cl.
*G03B 27/42* (2006.01)
*G03F 7/20* (2006.01)
(Continued)

(52) U.S. Cl.
CPC ...... *G03F 7/70558* (2013.01); *G03F 7/70025* (2013.01); *G03F 7/70516* (2013.01);
(Continued)

(58) Field of Classification Search
CPC ...... H01S 3/1305; H01S 3/1301; H01S 3/225; H01S 3/005; H01S 3/2232; H01S 3/0057;
(Continued)

(56) References Cited

U.S. PATENT DOCUMENTS 4,180,784 A 12/1979 Nelson et al.
5,526,093 A 6/1996 Takahashi
(Continued)

FOREIGN PATENT DOCUMENTS

EP 0 065 699 12/1982
JP S54-25695 2/1979
(Continued)

OTHER PUBLICATIONS

International Search Report mailed Aug. 12, 2014 in corresponding International Patent Application No. PCT/EP2014/057709.
(Continued)

*Primary Examiner* — Mesfin Asfaw
(74) *Attorney, Agent, or Firm* — Pillsbury Winthrop Shaw Pittman LLP

(57) ABSTRACT

A method of selecting a periodic modulation to be applied to a variable of a radiation source, wherein the source delivers radiation for projection onto a substrate and wherein there is relative motion between the substrate and the radiation at a scan speed, the method including: for a set of system parameters and for a position on the substrate, calculating a
(Continued)

quantity, the quantity being a measure of the contribution to an energy dose delivered to the position that arises from the modulation being applied to the variable of the source, wherein the contribution to the energy dose is calculated as a convolution of: a profile of radiation, and a contribution to an irradiance of radiation delivered by the source; and selecting a modulation frequency at which the quantity for the set of system parameters and the position on the substrate satisfies a certain criteria.

20 Claims, 5 Drawing Sheets

(51) Int. Cl.
    *H01S 3/104*     (2006.01)
    *H01S 3/0975*     (2006.01)
    *H01S 3/225*     (2006.01)

(52) U.S. Cl.
    CPC ............ *H01S 3/104* (2013.01); *H01S 3/0975* (2013.01); *H01S 3/225* (2013.01)

(58) Field of Classification Search
    CPC ...... H01S 3/0085; H01S 3/10015; H01S 3/13; H01S 3/1307; H01S 3/2251; H01S 5/4012; H01S 3/0071; H01S 3/2256; H01S 3/2308; H01S 3/0014; H01S 3/0092; H01S 3/134
    See application file for complete search history.

(56) References Cited

U.S. PATENT DOCUMENTS

| | | |
|---|---|---|
| 5,659,383 A | 8/1997 | Ozawa |
| 5,728,495 A | 3/1998 | Ozawa |
| 5,929,977 A | 7/1999 | Ozawa |
| 6,141,081 A * | 10/2000 | Das .................... G03F 7/70358 250/492.1 |
| 6,501,535 B1 | 12/2002 | Ozawa |
| 7,016,013 B2 | 3/2006 | Van Der Biggelaar et al. |
| 7,023,885 B1 | 4/2006 | Toki |
| 2013/0201468 A1* | 8/2013 | Manakli ................ B82Y 10/00 355/77 |

FOREIGN PATENT DOCUMENTS

| | | |
|---|---|---|
| JP | S55-148480 | 11/1980 |
| JP | S57-186381 | 11/1982 |
| JP | H08-250402 | 9/1996 |
| JP | H09-148216 | 6/1997 |
| JP | H09-320932 | 12/1997 |
| JP | 2001-023888 | 1/2001 |
| JP | 2001-326159 | 11/2001 |
| WO | 2011/128393 | 10/2011 |

OTHER PUBLICATIONS

Taiwan Office Action dated Apr. 13, 2016 in corresponding Taiwan Patent Application No. 103116148.
Korean Office Action mailed Oct. 11, 2016 in corresponding Korean Patent Application No. 10-2015-7033674.
Japanese Office Action mailed Aug. 15, 2016 in corresponding Japanese Patent Application No. 2016-514314.

* cited by examiner

METHOD OF CONTROLLING A RADIATION SOURCE AND LITHOGRAPHIC APPARATUS COMPRISING THE RADIATION SOURCE

CROSS-REFERENCE TO RELATED APPLICATIONS

This application is the U.S. national phase entry of PCT patent application no. PCT/EP2014/057709, which was filed on Apr. 16, 2014, which claims the benefit of priority of U.S. provisional application No. 61/825,300, which was filed on May 20, 2013, each of which are incorporated herein in its entirety by reference.

FIELD

The present invention relates to operation of a radiation source used to deliver radiation to, for example, a lithographic apparatus.

BACKGROUND

A lithographic apparatus is a machine that applies a desired pattern onto a target portion of a substrate. Lithographic apparatus can be used, for example, in the manufacture of integrated circuits (ICs). In that circumstance, a patterning device, which is alternatively referred to as a mask or a reticle, may be used to impart a radiation beam with a circuit pattern corresponding to an individual layer of the IC, and this pattern can be imaged onto a target portion (e.g. comprising part of, one or several dies) on a substrate (e.g. a silicon wafer) that has a layer of radiation-sensitive material (resist). In general, a single substrate will contain a network of adjacent target portions that are successively exposed. Known lithographic apparatus include so-called scanners, in which each target portion is irradiated by scanning the pattern through the radiation beam in a given direction (the "scanning"-direction) while synchronously scanning the substrate parallel or anti parallel to this direction.

The radiation beam may be produced by a radiation source. It is desirable, for example, to operate the radiation source in a manner which obviates or mitigates one or more of the problems of the art, whether identified herein or elsewhere.

SUMMARY

According to an aspect, there is provided a method of selecting a periodic modulation to be applied to a variable of a radiation source, wherein the radiation source is operable to deliver radiation to a lithographic apparatus for projection as a band of radiation onto a substrate and wherein the lithographic apparatus is operable to move the substrate relative to the band of radiation at a scan speed, the method comprising:

for one or more sets of system parameters and for one or more positions on the substrate calculating a quantity, the quantity being a measure of the contribution to an energy dose delivered to the position that arises from the modulation applied to the variable of the radiation source, wherein the contribution to the energy dose is calculated as a convolution of: a profile of the band of radiation, and a contribution to an irradiance of radiation delivered by the radiation source; and selecting a modulation frequency at which the quantity for each of one or more sets of system parameters and each of the one or more positions on the substrate satisfies certain criteria.

The dose of radiation received by a point on the substrate is defined as the amount of energy per unit area which is received by that point on the substrate.

Such an arrangement allows a modulation to be applied to the variable of the radiation source while still having quantitative control over the effect of the applied modulation on the dose of radiation received by a point on the substrate. This may be particularly advantageous since, in general, it is desirable to have accurate control over the dose of radiation received by a point on the substrate.

The modulation may be any periodic waveform. In an embodiment, the modulation is a sinusoidal modulation. This may be advantageous if the applied modulation is used to calibrate the lithographic apparatus since a more complicated waveform may complicate the calibration process while offering little or no advantage.

The radiation source may be a laser. The laser may be a gas laser. The laser may be an excimer laser.

The modulation may be applied to an amplitude of the output power or irradiance of the radiation source. Advantageously, by varying an amplitude of the output power or irradiance of the radiation source in a known way, a response of the lithographic apparatus to the radiation may be determined. This may allow accurate control over the power or irradiance of the beam that is projected onto the substrate.

In an embodiment, the modulation may be applied to a variable of the radiation source which may indirectly affect the output power or irradiance of the radiation source. For example, the radiation source may have one or more variables that can be varied so as to vary the output power or irradiance of the radiation source and the modulation may be applied to one of the one or more variables. For example, for embodiments wherein the radiation source is a laser, energy may be supplied to the gain medium of the laser by an external source. This process is known as pumping, and the external source may comprise: an electrical power supply (electrical pumping), electromagnetic radiation (optical pumping), gas flow (gas dynamic pumping), or some other suitable energy source. The external power source may be adjustable, so that the amount of pump power supplied to the gain medium can be varied. For this purpose, the external power source may have one or more input variables that can be varied so as to vary the power supplied to the gain medium. In one embodiment, the radiation source is an excimer gas laser and the modulation is applied to a voltage across a pair of discharge conductors.

The profile of the band of radiation is dependent upon the optical components of the lithographic apparatus. In general, the profile of radiation may be described by a function, which describes a general shape of the profile of the radiation in a scan direction of the lithographic apparatus.

The profile of the band of radiation may be non-uniform. Since the energy dose is calculated as a convolution of a profile of the band of radiation and a contribution to an irradiance delivered by the radiation source, advantageously, an embodiment of the invention allows the effect of a non-uniform profile on the energy dose to be taken into account.

The profile of the band of radiation may comprise a raised central portion and lower edge portions. Advantageously, such a profile reduces the variation in the dose of radiation received by different points on the substrate when the radiation source is pulsed. For example, the profile may be a trapezium, a truncated Gaussian or any other shape as desired or required.

Calculating the quantity for more than one position on the substrate is advantageous because, in general, for a fixed modulation and radiation profile, there will be a range of doses of radiation delivered to different points on the substrate. Therefore, by using more than one position on the substrate, the method may help ensure that the effect of the applied modulation on the dose of radiation received by all points on the substrate satisfies the criteria. For example, the calculation may be performed for a plurality of positions on the substrate and a worst case scenario, being, for example, the position at which the quantity is largest, may be found. By having the quantity satisfy the criteria for this worst case scenario, one can help ensure that the quantity will satisfy the criteria for all positions on the substrate.

The system parameters may comprise any parameters of the radiation source or lithographic apparatus which affect the doses of radiation received by points on the substrate and which may be varied during the lifetime of the apparatus.

The system parameters may comprise the time taken for the band of radiation to sweep past a position on the substrate.

The system parameters may comprise the size and shape of the profile of radiation.

The system parameters may comprise the scan speed.

The system parameters may comprise a phase of the modulation.

The radiation produced by the radiation source may be a pulsed radiation beam having a pulse frequency. The pulsed radiation may have any pulse train. The shape, duration and/or frequency of the pulses may be chosen as desired or required. The pulse frequency may, for example, be around 6 KHz, which is equivalent to a pulse time period of around 17 ms. The duration of the pulses may be significantly smaller than the time period of the pulse train. For example, the ratio of the time period of the pulse train to the duration of the pulses may be of the order of 1000. The duration of the pulses may, for example, be around 150 ns.

For embodiments where radiation produced by the radiation source is a pulsed radiation beam, the system parameters may comprise one or more selected from the following: the pulse frequency $f_p$; a phase of the pulsed radiation beam; the number of pulses that contribute to an energy dose; and/or a ratio of the scan speed $v_s$ to the pulse frequency $f_p$.

The quantity may be the amplitude of a modulation in the energy dose received by the point on the substrate expressed as a percentage of an average energy dose. For example, the quantity may be proportional to the ratio of the contribution to an energy dose delivered to the position on the substrate that arises from the modulation to an energy dose that would be delivered to the position on the substrate if no modulation had been applied.

The quantity may be normalized by the amplitude of the modulation that is applied to a variable of the radiation source.

The quantity may be normalized by the amplitude of the modulation that is applied to a variable of the radiation source expressed as a percentage of an average value of the variable.

The criteria may require the quantity to be below a certain threshold. Additionally or alternatively, the criteria may require the modulation frequency to be at a local minimum of the quantity or within a particular amount thereof.

The modulation may be applied to the variable of the radiation source while the band of radiation beam is being projected onto the substrate.

The method may further comprise using the modulation that is applied to the variable of the radiation source to calibrate a lithographic apparatus. The calibration of the lithographic apparatus may comprise measuring an irradiance of a radiation beam and comparing this to the value of the variable of a radiation source to which the modulation is applied.

The method may be used to select a suitable modulation frequency as desired or required. The method may be used to select a suitable modulation frequency relatively infrequently during the lifetime of the lithographic apparatus. For example, a suitable modulation frequency may be selected only once and a modulation at this frequency may be applied for calibration purposes for the duration of the lifetime of the apparatus. In an embodiment, the method may be used to select a suitable modulation frequency each time any parameter of the radiation source or lithographic apparatus that affects the doses of radiation received by points on the substrate changes significantly.

According to an aspect, there is provided a method of calibrating a lithographic apparatus, the method comprising:
measuring the irradiance of a radiation beam produced by a radiation source, the radiation source having one or more variables that can be varied so as to vary the output power or irradiance of the radiation source, wherein a periodic modulation is applied to one or more of the one or more variables;
determining a relationship between the one or more variables and the measured irradiance of the radiation beam;
controlling the value of the one or more variables of the radiation source according to the determined relationship in order to control the irradiance of the radiation beam;
using a patterning device to impart the radiation beam with a pattern in its cross-section; and
projecting the patterned radiation beam onto a target portion of a substrate as a band of radiation;
wherein the frequency of the periodic modulation is selected according to a method described herein.

The irradiance of the beam of radiation may be parameterized as a polynomial function of the variable of a radiation source and the calibration of the lithographic apparatus may involve the determination of the values of one or more parameters of the function. For example, the irradiance of the beam of radiation may be parameterized as a linear function of the variable of the radiation source and the calibration of the lithographic apparatus may involve the determination of the values of a gain and an offset.

The values of the one or more of the parameters may be determined using a lock-in amplifier. This may be particularly applicable for embodiments wherein the radiation source is a continuous source.

The determination of the values of the one or more of the parameters may involve the determination of a differential of the irradiance of the beam of radiation with respect to a variable of the radiation source.

Additionally or alternatively, the values of the one or more of the parameters may be determined using spectrum analysis. The spectrum analysis may be a Fourier type analysis. The spectrum analysis may involve determining a Fourier transform of: the variable to which the modulation was applied; and the measured irradiance. For embodiments wherein the radiation source is pulsed, the Fourier transform may be a discrete Fourier transform. The discrete Fourier transform may be calculated using a Fast Fourier transform algorithm. Advantageously, this reduces the computation time of the discrete Fourier transform. The spectrum analysis may involve the comparison of the coefficients of one or more frequency components of the variable of the radiation source and the irradiance of the beam of radiation. The spectrum analysis may involve comparing the coefficients of only a small number of frequency components of the two signals. For such embodiments, rather than calculating a full Fourier transform, an algorithm which allows only the desired frequency components to be calculated may be used. For example, the coefficients of the one or more frequency components of the variable of the radiation source and the irradiance of the beam of radiation may be determined using the Goertzel algorithm.

For embodiments wherein the radiation source is pulsed, or sampled in any other way, the frequency of the modulation may be chosen so that aliasing effects have a negligible effect on the determination of the one or more parameters. For example, the frequency of the modulation may be chosen so that higher order harmonics of the applied modulation are not aliased onto lower order frequency components that are used to determine the values of the one or more of the parameters. Advantageously, this may allow for an accurate determination of the one or more of the parameters despite the sampling of the irradiance signal.

The highest frequency component of the periodic modulation may be chosen so that it is lower than half the pulse frequency. Advantageously, this allows the periodic modulation to be reconstructed despite the sampling of the irradiance signal by the pulsing of the radiation.

The calibration method may be an online calibration method. That is, the one or more parameters may be determined while the substrate is being exposed to radiation from the radiation source.

According to an aspect, there is provided a lithographic apparatus comprising:
 a controller configured to output a control signal to a radiation source, wherein the control signal controls the value of a variable of the radiation source and wherein a modulation is applied to the control signal;
 a radiation sensor configured to measure the irradiance of a radiation beam produced by the radiation source;
 a support structure configured to support a patterning device, the patterning device serving to impart the radiation beam with a pattern in its cross-section;
 a substrate table configured to support a substrate; and
 a projection system configured to project the patterned radiation beam onto a target portion of the substrate, wherein the controller is further configured to:
  calculate a relationship between the variable of the radiation source and the irradiance of the radiation beam, and
  control the control signal according to the calculated relationship in order to control the irradiance of the radiation beam; and
 wherein a frequency of the applied modulation is selected according to a method described herein.

Different features of different aspects of the invention may be combined together where appropriate.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
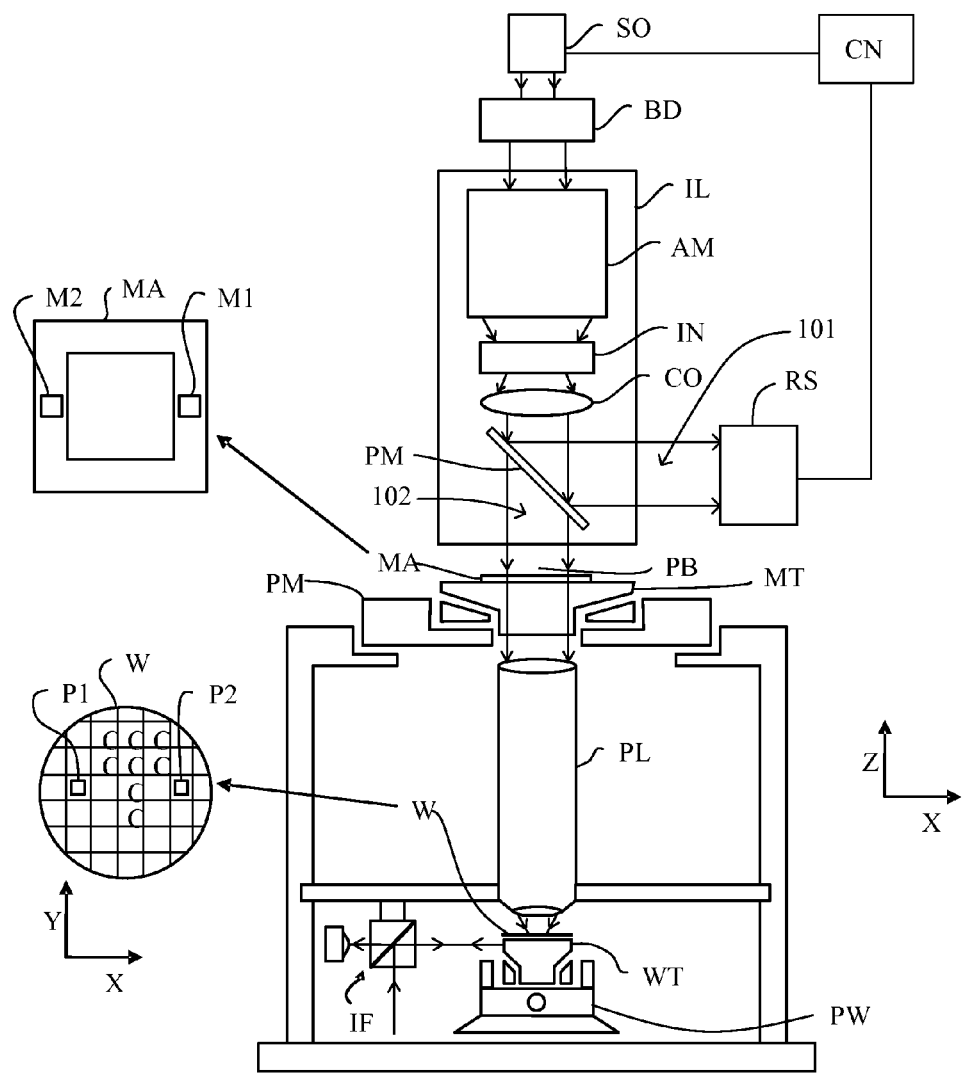
FIG. 1 depicts a lithographic apparatus according to an embodiment of the invention.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5-20 nm).

The term "patterning device" used herein should be broadly interpreted as referring to a device that can be used to impart a radiation beam with a pattern in its cross-section such as to create a pattern in a target portion of the substrate. It should be noted that the pattern imparted to the radiation beam may not exactly correspond to the desired pattern in the target portion of the substrate. Generally, the pattern imparted to the radiation beam will correspond to a particular functional layer in a device being created in the target portion, such as an integrated circuit.

A patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned.

The support structure holds the patterning device. It holds the patterning device in a way depending on the orientation of the patterning device, the design of the lithographic apparatus, and other conditions, such as for example whether or not the patterning device is held in a vacuum environment. The support can use mechanical clamping, vacuum, or other clamping techniques, for example electrostatic clamping under vacuum conditions. The support structure may be a frame or a table, for example, which may be fixed or movable as required and which may ensure that the patterning device is at a desired position, for example with respect to the projection system. Any use of the terms "reticle" or "mask" herein may be considered synonymous with the more general term "patterning device".

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "projection lens" herein may be considered as synonymous with the more general term "projection system".

The illumination system may also encompass various types of optical components, including refractive, reflective, and catadioptric optical components for directing, shaping, or controlling the beam of radiation, and such components may also be referred to below, collectively or singularly, as a "lens".

The lithographic apparatus may be of a type having two (dual stage) or more substrate tables (and/or two or more support structures). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g. water, so as to fill a space between the final element of the projection system and the substrate. Immersion techniques are well known in the art for increasing the numerical aperture of projection systems.

FIG. 1 schematically depicts a lithographic apparatus according to a particular embodiment of the invention. The apparatus comprises:

- an illumination system (illuminator) IL to condition a beam PB of radiation (e.g. UV radiation or DUV radiation).
- a support structure (e.g. a mask table) MT to support a patterning device (e.g. a mask) MA and connected to first positioning device PM to accurately position the patterning device with respect to item PL;
- a substrate table (e.g. a wafer table) WT for holding a substrate (e.g. a resist coated wafer) W and connected to second positioning device PW for accurately positioning the substrate with respect to item PL; and
- a projection system (e.g. a refractive projection lens) PL configured to image a pattern imparted to the radiation beam PB by patterning device MA onto a target portion C (e.g. comprising one or more dies) of the substrate W.

As here depicted, the apparatus is of a transmissive type (e.g. employing a transmissive mask). Alternatively, the apparatus may be of a reflective type (e.g. employing a programmable mirror array of a type as referred to above).

The illuminator IL receives a beam of radiation from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising for example suitable directing mirrors and/or a beam expander. The source SO and the illuminator IL, together with the beam delivery system BD if required, may be referred to as a radiation system.

The illuminator IL may comprise an adjuster AM configured to adjust the angular intensity distribution of the beam. Generally, at least the outer and/or inner radial extent (commonly referred to as -outer and -inner, respectively) of the intensity distribution in a pupil plane of the illuminator can be adjusted. In addition, the illuminator IL generally comprises various other components, such as an integrator IN and a condenser CO. The illuminator provides a conditioned beam of radiation PB, having a desired uniformity and intensity distribution in its cross section.

The radiation beam PB is incident on the patterning device (e.g. mask) MA, which is held on the support structure MT. Having traversed the patterning device MA, the beam PB passes through the lens PL, which focuses the beam onto a target portion C of the substrate W. With the aid of the second positioning device PW and position sensor IF (e.g. an interferometric device), the substrate table WT can be moved accurately, e.g. so as to position different target portions C in the path of the beam PB. Similarly, the first positioning device PM and another position sensor (which is not explicitly depicted in FIG. 1) can be used to accurately position the patterning device MA with respect to the path of the beam PB, e.g. after mechanical retrieval from a mask library, or during a scan. In general, movement of the object tables MT and WT will be realized with the aid of a long-stroke module (coarse positioning) and a short-stroke module (fine positioning), which form part of the positioning device PM and PW. Patterning device MA and substrate W may be aligned using patterning device alignment marks M1, M2 and substrate alignment marks P1, P2.

The depicted apparatus may be used in a scan mode. In the scan mode, the support structure MT and the substrate table WT are scanned synchronously while a pattern imparted to the beam PB is projected onto a target portion C (i.e. a single dynamic exposure). The velocity and direction of the substrate table WT relative to the support structure MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the length (in the scanning direction) of the target portion.

The radiation source SO delivers radiation to the lithographic apparatus for projection as a band of radiation on to the substrate W. By moving the substrate table WT, the lithographic apparatus is operable to move the substrate W relative to the band of radiation at a scan speed $v_s$. During exposure, the lithographic apparatus may be operable to move the substrate W relative to the band of radiation through a fixed distance. By doing this the lithographic apparatus may therefore be operable to expose a target portion C of substantially fixed area to radiation. For example, the target portion C may comprise part of, one or several dies. After exposure of a first target portion C, the lithographic apparatus may be further operable to move the substrate W relative to the projection system PL so that a second target portion C can be exposed to radiation. A single wafer may be exposed to radiation in a plurality of steps, each step involving the exposure of a target portion C followed by a movement of the substrate W.

In general it is desirable to have accurate control over the dose of radiation received by each point on the substrate W, the dose of radiation being defined as the amount of energy per unit area which is received by the substrate W. The dose of radiation may also be referred to as energy dose or dose. It may be desirable to control the dose of radiation sufficiently accurately that variation of a critical dimension of a feature formed on the substrate W is below a desired threshold.

During a scanning exposure, the dose of radiation E(r) delivered to a point (at position r) on the substrate W is given by a time integral of the irradiance I(r,t) of the radiation for that point:

$$E(r) = \int_{t_1}^{t_2} I(r, t) dt, \quad (1)$$

where $t_1$ is the time at which a leading edge of the band of radiation passes position r and $t_2$ is the time at which a trailing edge of the band of radiation passes position r.

The irradiance is the power received by the substrate W per unit area and is given by:

$$I(r,t) = I_{SO}(t) \times s(r,t) \times m(r). \quad (2)$$

where the $I_{SO}(t)$ is the irradiance of the radiation beam; s(r,t) is a dimensionless distribution which describes a spatial profile of the band of radiation; and m(r) is a dimensionless distribution that represents the pattern imparted on the radiation beam by the patterning device MA. In the following discussion, for simplicity, the contribution to energy dose that arises from the pattern imparted on the radiation beam by the patterning device MA is ignored. Therefore in the following, the value of m is set at m=1.

The profile s(r,t) of the band of radiation is dependent upon the optical components of the illuminator IL. In general, a point r on the substrate W may be defined by two coordinates x, y. For example, coordinate y may define the position of r in a scan direction and coordinate x may describe the position of r in a direction substantially perpendicular to the scan direction. The value of the dimensionless distribution s(r,t) may be dependent upon the position of r in a scan direction (y) and may be independent of the position of r perpendicular to the scan direction (x). Therefore, the profile of radiation may be described by a function $f(z)$, which describes a general shape of the profile of the radiation in a scan direction. At a given point (at position r) on the substrate W, the value of the dimensionless distribution s(r,t) may be given by:

$$s(r,t) = f(y - v_s t), \quad (3)$$

where the general shape described by $f(z)$ effectively moves across the substrate W in the scan direction y at speed $v_s$ (e.g., by virtue of the substrate moving "under" the substantially stationary radiation beam).

By substituting Eqs. 2 & 3 into Eq. 1 (with m=1), it can be seen that the dose of radiation E(y) received by a point (position y) on the substrate is given by a convolution of the profile of the band of radiation and the irradiance of the radiation source:

$$E(y) = \int_{t_1}^{t_2} [I_{SO}(t) \times f(y - v_s t)] dt, \quad (4)$$

where, once again, $t_1$ and $t_2$ are the times at which a leading edge and a trailing edge of the band of radiation respectively passes position r.

Figure 2B:
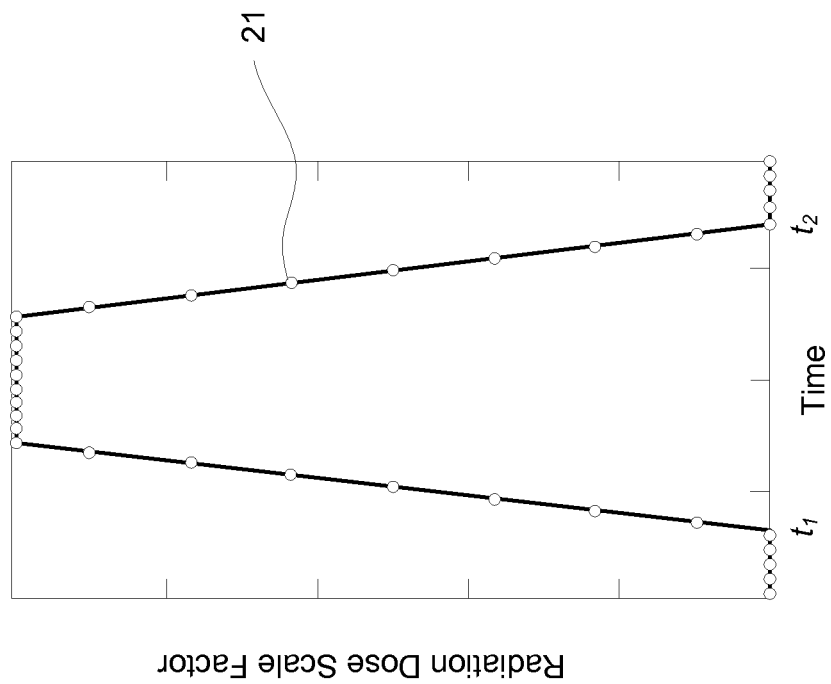
FIG. 2b is a schematic graph showing how the profile of a band of radiation may affect the dose of radiation which a target point on the substrate receives over time as the radiation beam profile depicted in FIG. 2a is scanned over the target point.
Figure 2A:
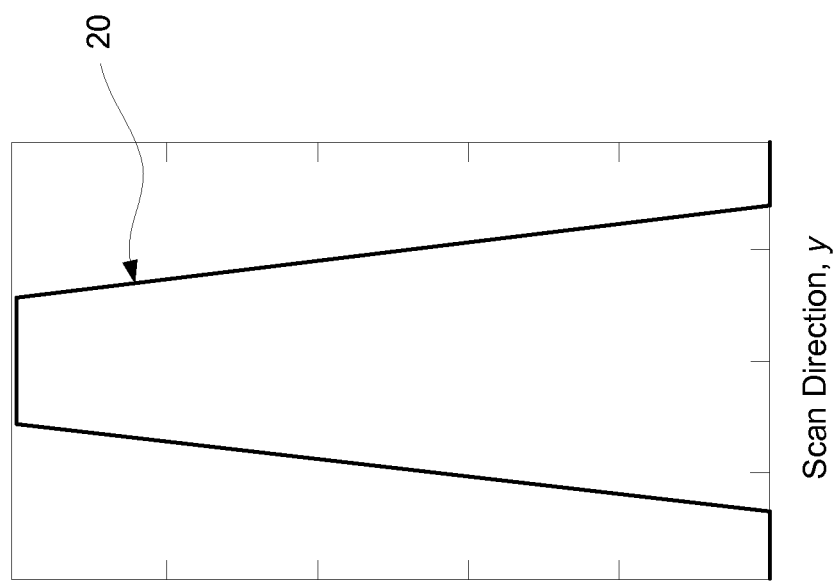
FIG. 2a is a schematic graph of a profile of a band of radiation which may be projected onto a substrate by the lithographic apparatus as viewed in a scan direction.

FIG. 2a is a schematic graph of an example profile 20 of the band of radiation in the scan direction. The horizontal axis of FIG. 2a represents a direction in which the radiation beam is scanned over the substrate (conventionally referred to as the y-direction). The profile 20 has a trapezoid like shape. However, the profile may take other shapes. For example, the profile may be a 'top-hat' shape or a truncated Gaussian (or 'Gaussian-like') shape.

The radiation source SO may produce a radiation beam which is pulsed with a pulse frequency $f_p$. For example, the radiation source SO may comprise a laser (e.g. an excimer laser) which produces a pulsed radiation beam having a pulse frequency $f_p$. For such an arrangement, the dose of radiation which is received by a given point on the substrate W is a sum over all pulses which irradiate that given point of the doses of radiation delivered by each pulse. The number of pulses which contribute to the dose of radiation for a given point is dependent upon: the time taken for the band of radiation to sweep past that point; the pulse frequency $f_p$; and the phase of the radiation pulse train as the leading edge of the profile passes the given point, i.e. the amount of time which passes between the leading edge of the profile passing the given point and the first pulse irradiating it. The time taken for the band of radiation to sweep past a point is given by the ratio of the width of the band of radiation to the scan speed $v_s$.

FIG. 2b is a schematic graph showing how the profile of the band of radiation affects the dose of radiation which a given point on the substrate W in the scan direction receives. In particular, it shows the effect of the profile 20 of the band of radiation shown in FIG. 2a used in conjunction with a pulsed radiation source SO. As the band of radiation sweeps past the given point, that point will receive doses of radiation at regularly spaced intervals, represented schematically as a plurality of dots 21. The interval between two sequential doses of radiation is given by the inverse of the pulse frequency $f_p$. As the band of radiation is scanned over the target point, each pulse 21 of radiation exposes the target point. The dose of energy delivered by each pulse is dependent upon the value of the radiation profile at the time of that pulse. The vertical axis of FIG. 2b represents the profile of the band of radiation and is a dimensionless factor by which each pulse dose is weighted in the sum of doses which contribute to the dose delivered to that point. $t_1$ is the time at which a leading edge of the band of radiation passes the given point and $t_2$ is the time at which a trailing edge of the band of radiation passes it. For $t<t_1$ and $t>t_2$ pulses do not contribute to the dose for that point and the dimensionless factor is zero.

For embodiments utilizing a pulsed radiation source SO, the irradiance of the radiation beam will be dependent upon the pulse train of the radiation source. For example, $$I_{SO}(t)=I_{SO,continuous}(t) \times p(t), \qquad (5)$$

where $I_{SO,continuous}(t)$ is an irradiance of the radiation source and p(t) is a dimensionless pulse waveform. $I_{SO,continuous}(t)$ may be viewed as the irradiance of an equivalent continuous radiation source and the pulse waveform describes how this is sampled at the pulse frequency $f_p$.

The pulsed radiation may have any pulse train. The shape, duration and frequency of the pulses may be chosen as desired or required. The pulse frequency may, for example, be around 6 KHz, which is equivalent to a pulse time period of around 17 ms (although other pulse frequencies may be used). The duration of the pulses may be significantly smaller than the time period of the pulse train. For example, the ratio of the time period of the pulse train to the duration of the pulses may be of the order of 1000 (or may be some other value). The duration of the pulses may, for example, be around 150 ns (although other pulse durations may be used).

As discussed above, in general it is advantageous to expose each point on the substrate W with a certain (e.g., predetermined) dose of radiation. Furthermore, in general, it may be desirable to accurately control the dose of radiation received by each point on the substrate W. It is therefore advantageous, for example, to be able to control the irradiance of the radiation beam.

Energy is supplied to the radiation source SO. For example, for embodiments wherein the radiation source is a laser, energy may be supplied to the gain medium of the laser by an external source. This process is known as pumping, and the external source may comprise: an electrical power supply (electrical pumping), electromagnetic radiation (optical pumping), gas flow (gas dynamic pumping), or some other suitable energy source. The external power source may be adjustable, so that the amount of pump power supplied to the gain medium can be varied. The external power source may be provided with one or more input variables that can be varied so as to vary the power supplied to the gain medium. For example, in the case of a gas laser such as an excimer laser the external power source may comprise a pair of discharge conductors across which a high voltage is applied. For such embodiments, the power supplied to the gain medium can be varied by varying the voltage applied across the conductors.

In general, the irradiance of the laser beam will be dependent upon the pump power supplied by the external power source. Therefore, in order to accurately control the irradiance of the beam, and in turn the dose delivered to the substrate W, it is desirable to know the relationship between the one or more variables of the external power supply and the irradiance of the beam. If this relationship is well known, a desired irradiance may be achieved by choosing the value(s) of the one or more variables accordingly. However, in general the relationship is not well known. The relationship may be parameterized as a polynomial with one or more free parameters that may be determined during a calibration process. Furthermore, the relationship may vary with time and therefore it may be necessary to perform a calibration periodically.

For example, in the case of an excimer laser the irradiance of the laser is dependent upon the voltage V applied across the two conductors. In general, this relationship is non-linear. For the range of voltages V that are used in practice, an irradiance E of the laser may be well approximated by a polynomial expansion of the voltage V. For a sufficiently small range of voltages V, the relationship between the irradiance E and the voltage may be approximated by a linear relationship:

$$E=O+G \times V, \qquad (6)$$

where the gain G and the offset O of the laser are parameters which can be determined during a calibration process. For larger ranges of voltage, a higher order polynomial with more tuneable parameters may be necessary to parameterize the relationship between the voltage V and the irradiance E.

In practice the measured irradiance E will include an element of noise and therefore the calibration process may use data from an extended time period to evaluate the one or more parameters used in the relationship between the one or more variables of the external power supply and the irradiance. The values of the one or more parameters may drift with time as the lithography apparatus is operating, and therefore the one or more parameters may be determined periodically using a calibration process.

The calibration process may comprise applying a known modulation to the one or more variables of the external power supply and measuring the response of the irradiance E to the variation in the one or more variables. The measured response of the irradiance E to the variation may be used to determine the value(s) of the one or more parameters used in the relationship between the one or more variables of the external power supply and the irradiance.

Accordingly, as part of the calibration process, a modulation having a certain (e.g., predetermined) frequency and amplitude may be applied to the one or more variables that can affect the power supplied to the gain material. For example, for an excimer laser, a modulation may be applied to the voltage V applied across the pair of conductors. In the following, the modulation may be referred to interchangeably as the modulation, the dither modulation or the dither. The modulation may have any suitable amplitude as desired or required. Such a modulation in the voltage V will result in a modulation in the doses received by points on the substrate W. Therefore, the amplitude of the modulation may be chosen so that the modulation in these doses remains within an acceptable amount of a mean dose. For example, the amplitude of the modulation may be chosen so that the doses received by points on the substrate W are within approximately 3% of a mean dose (although larger or smaller amplitudes may be chosen as appropriate). Furthermore, the amplitude of the modulation may be chosen so that a parameterization of the relationship between the one or more variables and the irradiance holds well for the range of values covered by the modulation. For example, for an excimer laser, the amplitude of the modulation may be chosen so that the linear relationship of Eq. 6 holds. Increasing the amplitude of the dither modulation will make it easier to determine a relationship between the pump power and the energy of radiation pulses emitted by the laser (or equivalently the irradiance of the laser). However, increasing the amplitude of the dither modulation will also increase the extent to which the dither influences the exposure dose received on the substrate W. The amplitude of the dither modulation may thus be kept to a minimum level which allows a relationship between the pump power and the energy of laser radiation pulses to be determined with a desired accuracy within a desired calibration timeframe.

The dither modulation may be any modulation which has periodic waveform. It may be desirable for the dither modulation to be a sinusoidal modulation having a certain frequency, since a more complicated waveform may impose additional constraints while offering little or no advantage. For example, a Fourier type spectrum analysis may be used to determine the one or more parameters which link the irradiance E to the applied voltage V (see below) and a dither modulation which contains a plurality of frequency components, even if well known, could complicate this analysis while offering little or no advantage.

Figure 3:
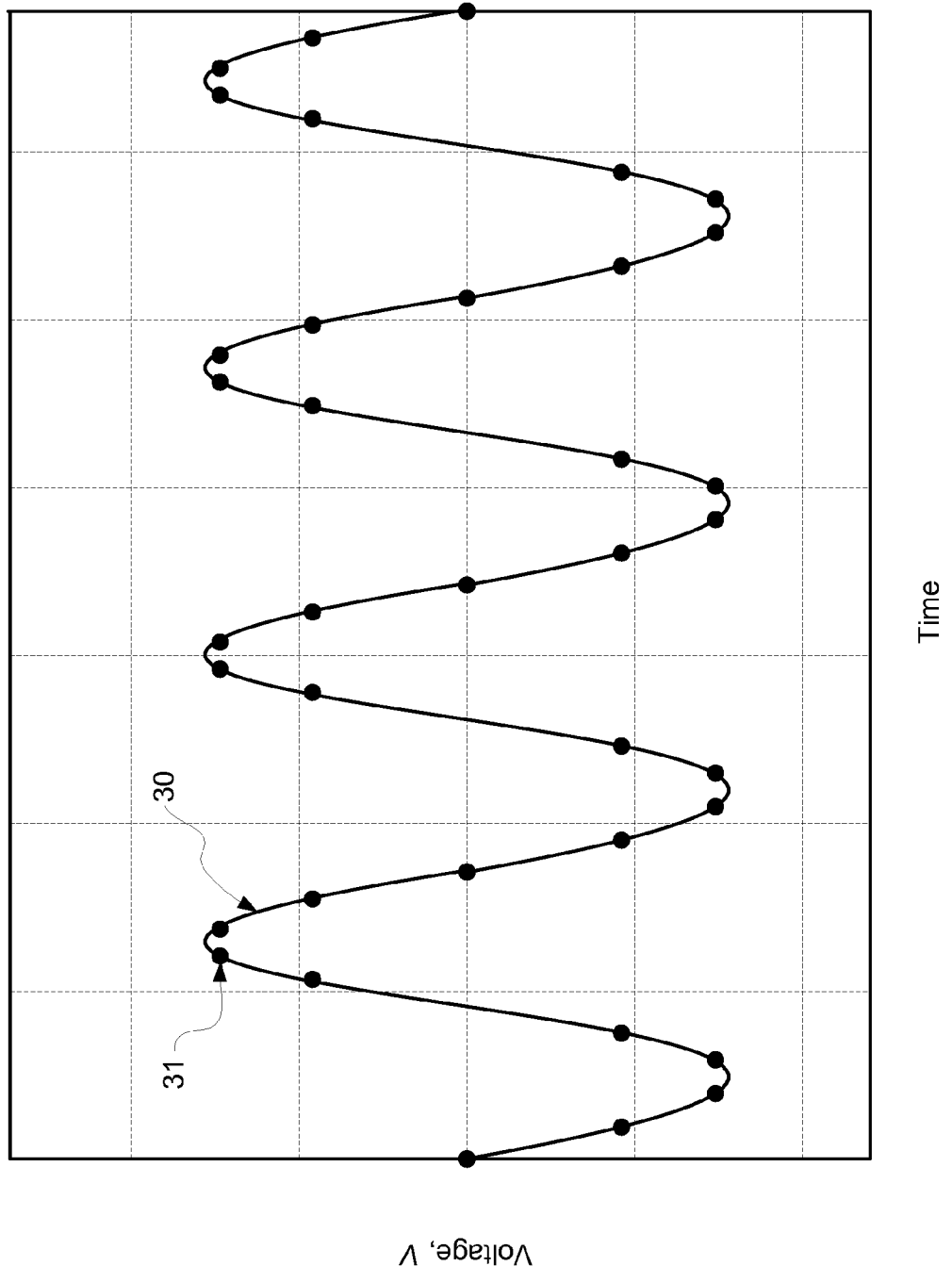
FIG. 3 is a graph of a variable of a radiation source to which a modulation has been applied as a function of time upon which the timings of radiation pulses produced by the radiation source are shown.

The dither modulation which is applied to the variable of the radiation source SO will cause a corresponding modulation of the irradiance E. FIG. 3 is a graph 30 of voltage V applied to an excimer laser as a function of time over the course of four periods of the dither modulation. The amplitude of the dither modulation may, for example, be only a small percentage of the mean voltage. However, the scale of the graph shown in FIG. 3 has been zoomed in to the scale of the dither modulation of the voltage V. The timing of the regularly spaced pulses, at which the dither modified voltage is sampled, is also shown on the graph as dots 31.

For embodiments where the radiation source SO is a continuous source, the value of one or more of the parameters which link the irradiance E to the variable to which the dither modulation has been applied may be determined using a lock-in amplifier. Additionally or alternatively, the value of the one or more of the parameters which link the irradiance E to the applied voltage V may be determined using spectrum analysis. This spectrum analysis may be a Fourier type analysis. This may involve determining a Fourier transform of: (a) the one or more variables to which the dither modulation was applied and (b) the measured irradiance E; and comparing the coefficients of one or more frequency components of these two signals. For embodiments wherein the radiation source SO is pulsed, the Fourier transform may be a discrete Fourier transform. The discrete Fourier transform may be calculated using a Fast Fourier transform algorithm. The spectrum analysis may involve comparing the coefficients of only a small number of frequency components of the two signals. For such embodiments, rather than calculating a full Fourier transform, an algorithm which allows only the desired frequency components to be calculated may be used. For example, the Goertzel algorithm may be used.

For embodiments where the radiation source SO produces a pulsed radiation beam, the pulsing of the radiation source effectively samples the irradiance of the beam at a rate of $f_p$. The frequency of the dither modulation $f_d$ may be lower than the pulse frequency $f_p$. In order for the sampling of the irradiance of the beam to be sufficient to reconstruct the dither modulation, the highest frequency component of the dither modulation should be lower than half the pulse frequency $f_p$ so that for each period of the dither modulation there are more than 2 radiation pulses.

This sampling of the irradiance of the beam may lead to an aliasing of the signal, wherein higher frequency components in the signal are aliased or 'folded back' to a lower frequency. For example, in a spectrum analysis of the irradiance of the beam using a discrete Fourier transform, a component with a frequency $f_0$ will, in addition to a contribution from the component of the signal with frequency $f_0$, receive contributions from components in the signal with a plurality of other image frequencies. In general, these image frequencies are given by $|f_0 - nf_p|$, where n is an integer. If the one or more parameters in the relationship between the variable of the radiation source SO to which the dither is applied and the irradiance of the beam are determined using a Fourier type analysis of the irradiance then this contamination from the image frequencies may prevent an accurate determination of the parameters. For example, if the linear relationship of Eq. 6 is assumed, the gain G may be determined by comparing the components of the voltage V and the irradiance E at the dither frequency $f_d$. The pulse frequency of $f_p$ may be chosen so that such aliasing effects have a negligible effect on the determination of the parameters.

In general, the energy of each radiation pulse depends on the phase of the dither modulation at the time at which the radiation pulse occurs. The pulse frequency $f_p$ may be an integer multiple of the dither frequency $f_d$, in which case the radiation pulses will occur at the same phase of the dither modulation for each period of the dither modulation. However, in practice it may be preferred that the pulse frequency $f_p$ is not an integer multiple of the frequency of the dither modulation, particularly if the relationship between the variable of the radiation source SO to which the dither is applied and the irradiance of the beam is non-linear. If this relationship is non-linear then in addition to the dither modulation the irradiance of the beam will contain higher order harmonics of the dither modulation. That is, the irradiance will contain components with frequencies of $2f_d$, $3f_d$, $4f_d$ and so on. If the pulse frequency $f_p$ is an integer multiple of the dither frequency $f_d$ then at least some of these higher order harmonics of the dither signal may coincide with the image frequencies that are aliased back to the dither frequency $f_d$. For example, if $f_p = 3f_d$ then the second and fourth harmonics of the dither modulation, with frequencies $2f_d$ and $4f_d$, will be aliased back to the dither frequency $f_d$. In turn, this may prevent an accurate determination of the one or more parameters in the relationship between the variable of the radiation source SO to which the dither is applied and the irradiance of the beam. For example, for an embodiment wherein the gain G in Eq. 6 is determined by comparing the components of the voltage V and the irradiance E at the dither frequency $f_d$ these contributions to the component of the irradiance with frequency $f_d$ from higher order harmonics may prevent an accurate determination of the gain G. For such an embodiment, the ratio of the dither frequency $f_d$ to the pulse frequency $f_p$ may be chosen so that higher harmonics of the dither modulation are not aliased back to the dither frequency $f_d$. For example, the frequency of the dither modulation $f_d$ may for example be given by:

$$f_d = \frac{7}{15} f_p, \tag{7}$$

although other ratios may be chosen. In one embodiment, the pulse frequency $f_p$ may be around 6 KHz and the frequency of the dither modulation $f_d$ may be around 2.8 KHz (although other frequencies may be used).

The irradiance E may be measured by a radiation sensor RS (see FIG. 1). The radiation sensor RS may be any sensor suitable to measure the energy of radiation incident upon the radiation sensor RS. For example the radiation sensor RS may be a photodiode. The radiation sensor RS may be positioned such that at least a portion of the radiation beam produced by the radiation source SO is incident upon the radiation sensor RS. For embodiments wherein only a portion of the radiation beam produced by the radiation source SO is incident upon the radiation sensor RS, the relationship between the dose received by the radiation sensor RS and the dose received by the substrate W should be known so that the latter can be determined from a measurement of the former.

An example positioning of the radiation sensor RS is depicted in FIG. 1. A partially transmissive mirror PM is positioned in the illuminator IL. The partially transmissive mirror PM reflects a first portion 101 of the radiation beam onto the radiation sensor RS. The remainder 102 of the radiation beam is transmitted by the partially transmissive mirror PM and passes to the patterning device MA. The fraction of the radiation beam which is reflected by the partially transmissive mirror PM (the first portion 101) may for example be of the order of a few percent or less of the radiation beam. If this fraction is known, the energy of the radiation beam 102 which is transmitted by the partially transmissive mirror PM may be calculated using measurements made by the radiation sensor RS. If the fraction is not known, the radiation sensor RS may be calibrated with a second radiation sensor (not shown) by replacing the substrate with the second radiation sensor and comparing the energy measured by both radiation sensors.

In other embodiments the partially transmissive mirror PM and the radiation sensor RS may be located at another position along the path of the radiation beam. For example the partially transmissive mirror PM and the radiation sensor RS may be positioned before the illuminator IL (e.g. in the beam delivery system).

The measured radiation irradiance E may be used in conjunction with the dither modulation signal to extract the variation in irradiance E which is caused by the dither modulation. The extracted variation of the irradiance which is caused by the dither modulation may be used in conjunction with the dither modulation, to calculate the relationship between the variable V (e.g., voltage V) of the radiation source SO to which the dither modulation is applied and the irradiance E. In particular the quantity dE/dV may be calculated. In the case of a linear relationship between the variable V and the irradiance E this may be equivalent to the gain G.

The calibration process may be performed by any suitable processor. For example it may be performed by a controller CN (shown in FIG. 1), which may comprise a microprocessor. The controller CN may be configured to calculate a relationship between the variable V of the radiation source SO to which the dither modulation is applied and the irradiance E of the radiation beam. The controller may be further configured to output a control signal to the radiation source SO (e.g. laser) which controls the variable V of the radiation source SO to which the dither modulation is applied. The control signal and hence the value of the variable V may be controlled according to the calculated relationship in order to control the irradiance E of the beam.

The method of calibrating the radiation source SO may be performed as an online calibration process. An online calibration process may comprise performing the above described calibration method while simultaneously projecting a pattern from the patterning device MA onto the substrate W. Performing the calibration as an online process is advantageous because it avoids a reduction of throughput of the lithographic apparatus which would arise if the calibration were to be performed as an offline process (i.e. calibration is performed when exposure of a substrate is not taking place). Performing the calibration as an online process is also advantageous because it allows for variation in the one or more calibration parameter which occur during exposure to be corrected as they occur.

An online calibration process may be performed in conjunction with one or more offline calibration processes. The accuracy of a calibration process may be related to the length of time for which a calibration process is performed. The duration of an offline calibration process may be reduced by performing an online calibration process in combination with the offline calibration process.

Performing an online calibration process may eliminate the use of an offline calibration process. In this case the online calibration process may be performed for the duration of an exposure of a substrate W, e.g. during exposure of each target portion C. The one or more calibration parameters may be, for example, updated at the end of the exposure of the substrate W according to the online calibration. The one or more new calibration parameters may then be used to control the radiation source SO during exposure of the next substrate W.

The one or more calibration parameters may change significantly with time. For example during exposure of a single substrate W, the gain G may drift by as much as 50%. If the calibration parameter is calculated before the exposure of a substrate W or a target portion C thereof then the calibration parameter may no longer be accurate at the end of the exposure of that substrate W or target portion C. Regions which are exposed towards the end of the exposure of a substrate W or target portion C may therefore receive substantially different doses of radiation compared to regions which are exposed at the beginning of the exposure of the substrate W or target portion C. It may therefore be desirable to update the calibration parameter during exposure of a substrate W. For example, a first region of a substrate W or target portion C may be exposed while a dither modulation is applied to the one or more variables that can affect the power supplied to the gain material and the energy of the radiation beam is measured. The measurements of the radiation beam during exposure of the first region may then be used to calculate the one or more parameters of the relationship between the one or more variables of the external power supply and the energy of the radiation beam E and the one or more calibration parameters may be updated. The updated calibration parameter may then be used to control the external source while a second region of a substrate W or a target portion C is exposed to the radiation beam. In this way the calibration parameter can be regularly updated without impacting the throughput of the lithographic apparatus.

As will be described further below, with reference to FIGS. 4a & 4b, during a calibration process wherein the dither modulation is applied during exposure (i.e. online calibration), the doses of radiation received by fixed points on the substrate W will be affected by the dither modulation. An embodiment is concerned with reducing or minimizing the effect of the dither modulation on the doses received by fixed points on the substrate W.

Figure 4B:
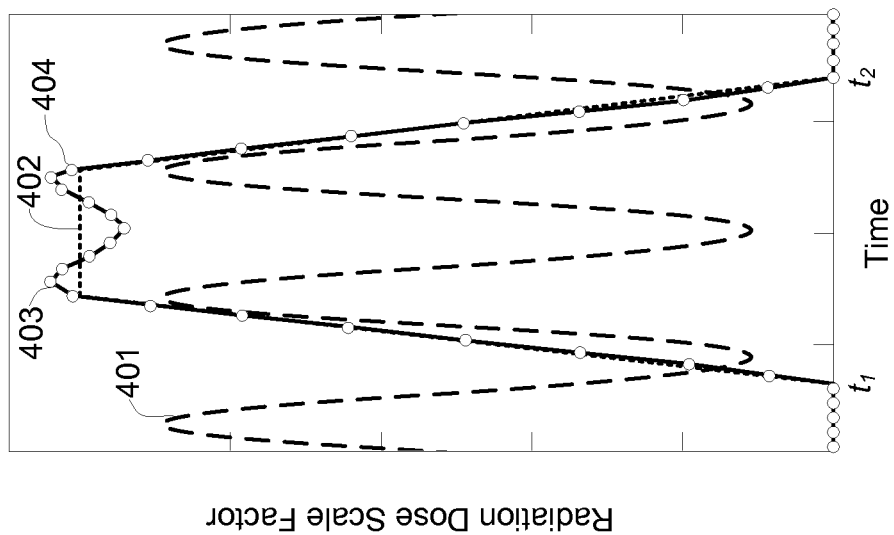
FIG. 4b shows schematically how a dose of radiation that a second target point of a substrate receives when the radiation beam profile depicted in FIG. 2a is scanned over the target point is affected when the radiation source is pulsed and a dither modulation has been applied to a variable of the radiation source.
Figure 4A:
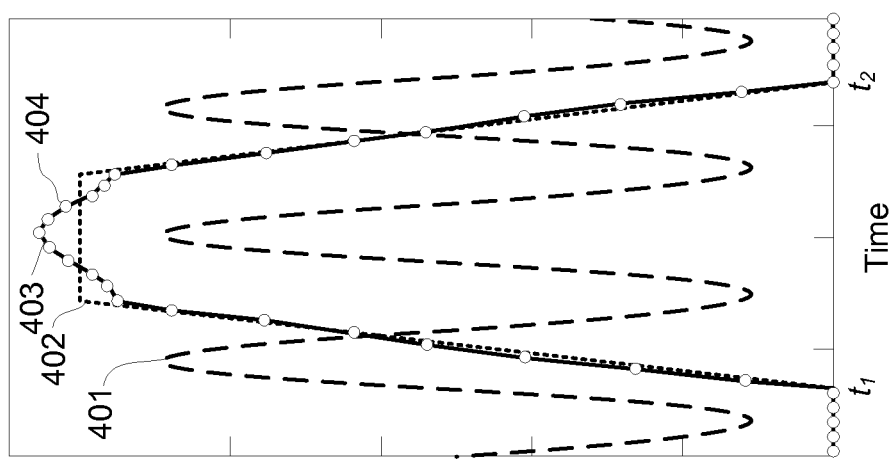
FIG. 4a shows schematically how a dose of radiation that a first target point of a substrate receives when the radiation beam profile depicted in FIG. 2a is scanned over the target point is affected when the radiation source is pulsed and a dither modulation has been applied to a variable of the radiation source.

FIG. 4a shows schematically the dose of radiation that a target point of the substrate W receives, when the radiation beam profile depicted in FIG. 2a is scanned over the target point and when the radiation source is pulsed and a dither modulation has been applied to a variable of the radiation source. Line 401 depicts the dither modulation which is applied to the variable of the radiation source. For an excimer laser to which an excitation voltage is applied, the amplitude of the dither modulation may for example be a small percentage of the mean. However, the scale of the vertical axis showing the voltage V in FIG. 4a has been zoomed in to the magnitude of the dither modulation and is offset from zero. Line 402 depicts the profile of the band of radiation, i.e. a dimensionless scale factor for pulses received by the target point. Line 402 is equivalent to the solid line in FIG. 2b. The dots 404 in FIG. 4a represent the pulses of radiation. Line 403 joins the dots and is a product of the two lines 401 and 402.

As explained further above, the dose E received by a fixed point on the substrate in the scanning direction (ignoring the effect of the patterning device MA) is given by a convolution of the profile of the band of radiation, and the irradiance of the radiation source (see Eq. 4). Assuming a linear relationship between the voltage V and the dose E and neglecting the effects of noise, for a continuous radiation source, this dose E would be proportional to the integral of line 403 with respect to time. For a pulsed radiation source, the dose would be proportional to the sum of the energies represented by dots 404.

In general, the dose of radiation to which the fixed point (which may be referred to as a target point) is exposed is dependent on the phase of the modulation as the leading edge of the profile passes that point. In the example depicted in FIG. 4a this phase is such that the center of the profile of the radiation beam passes over the target point at a time which corresponds to a peak in the dither modulation.

FIG. 4b is equivalent to FIG. 4a except that in the example depicted in FIG. 4b the phase of the applied modulation as the leading edge of the profile passes that point differs to that shown in FIG. 4a. In the example shown in FIG. 4b, this phase is such that the center of the profile the radiation beam passes over the target point at a time which corresponds to a trough in the dither modulation.

In each of the two examples depicted in FIGS. 4a and 4b, a different total dose of radiation is delivered to the target point as the radiation beam is scanned over the target point, due to the different phases of the radiation pulse train as the leading edge of the profile passes these two points.

In general, the dose of radiation to which the target point is exposed is also dependent on the phase of the radiation pulse train as the leading edge of the profile passes that point, i.e. the amount of time Δt which passes between the leading edge of the profile passing the target point and the first pulse irradiating it.

Therefore, in general for a fixed dither modulation, pulse train and slit profile, there will be a range of doses delivered to different points on the substrate W since in general the phases of the applied modulation and the radiation pulse train when the leading edge of the profile passes a given point will vary from point to point.

Consider applying a sinusoidal modulation to the voltage of an excimer laser:

$$V(t)=V_0+A_d \sin(2\pi f_d t+\Phi_d). \quad (8)$$

where $V_0$ is a constant offset voltage and $A_d$, $f_d$ and $\Phi_d$ are the amplitude, frequency and phase of the modulation. Assuming that there is a linear relationship between the voltage V and the irradiance of the radiation beam and neglecting the effects of noise, the irradiance of the beam will be given by (see Eq. 5):

$$I_{SO}(t)=[I_0+I_1 \sin(2\pi f_d t+\Phi_d)]\times[p(t)], \quad (9)$$

where $I_0$ is a constant offset irradiance and $I_1$ is an amplitude of a contribution to the irradiance from the dither applied to the voltage V(t).

By substituting this into Eq. 4, the dose delivered to a point y on the substrate will be given by:

$$E(y)=E_0(y)+E_d(y), \quad (10)$$

where $E_0(y)$ is the dose that would be delivered to that point if no modulation had been applied (i.e. if $A_d$=0) and where the contribution to the dose that arises from the modulation $E_d(y)$ is given by:

$$E_d(y) = \int_{t_1}^{t_2} [I_1\sin(2\pi f_d t + \varphi_d)] \times [p(t)] \times [f(y - v_s t)] dt. \quad (11)$$

The above calculation may be performed for a range of frequencies, and a frequency that reduces or minimizes the magnitude of $E_d(y)$ may be chosen. In general, a quantity that is related to $E_d(y)$ may be calculated and an embodiment may involve choosing a suitable modulation frequency that reduces that quantity.

For a fixed dither amplitude, pulse train and slit profile the contribution to the dose received by a fixed point on the substrate W that arises from the modulation $E_d(y)$ is dependent upon the frequency $f_d$ of the modulation. In particular, for a given slit profile, scan speed $v_s$ and pulse frequency $f_p$ there will be frequencies of the dither modulation which reduce the quantity. These frequencies may correspond to minima of the quantity.

For the case where the slit profile f(x) is a 'top hat' distribution and the radiation source SO is continuous (i.e. $f(y-v_s t)=p(t)=1$ in Eq. 11), when the time taken for the profile to sweep past a given point on the substrate W is an integer number of dither modulation periods, the contribution $E_d(y)$ will vanish. Furthermore, when the time taken for the profile to sweep past the given point is half a dither modulation period more than an integer number of dither modulation periods, the contribution $E_d(y)$ may be at a maximum. Therefore, for this unrealistic arrangement, if one were to plot a graph of $E_d(y)$ as a function of the modulation frequency $f_d$, one would expect to see minima at regularly spaced intervals in modulation frequency $f_d$. However, this pattern will in general be altered if either: (a) a non-uniform slit profile is used; or (b) a pulsed radiation source is used, as will be explained further below.

For a more complicated slit profile, the cancellation at local minima may not be perfect, and the frequencies at which cancellation occurs will in general not correspond to an integer number of modulation periods spanning the slit profile. This is because the slit profile $f(y-v_s t)$ will effectively apply different weights to different points on the sine curve.

Furthermore, for a pulsed radiation source, even for a uniform 'top hat' slit profile and when the time taken for the profile to sweep past a given point on the substrate W is an integer number of dither modulation periods, in general, there will not be a perfect cancellation and $E_d(y)$ will not vanish. The cancellation will depend on the relative phases of the pulse train and dither modulation (which will vary for different point on the substrate unless the pulse frequency $f_p$ is an integer multiple of the modulation frequency $f_d$), and will depend upon the phase of the pulse train and dither modulation as the leading edge of the radiation profile passes the point on the substrate.

Instead of the absolute value of $E_d(y)$, it may be desirable to consider a quantity which is proportional to $E_d(y)$ but which is normalized in some way. For example, it may be desirable to consider the ratio of $E_d(y)$ to $E_0(y)$, i.e. the relative size of the modulation in dose expressed as a percentage of the dose which would have been received had no dither been applied. It may further be desirable to compare this ratio to the ratio of the relative size of the modulation that was applied to the variable of the radiation source expressed as a percentage of that variable without the modulation, i.e. the ratio of $A_d$ to $V_0$. For example, one may wish to ensure that the modulation in the dose is at a given level, such as, say, 1%, given an applied modulation of, say 3%.

Accordingly, there is provided a method of selecting a periodic modulation to be applied to a variable of a radiation source, the radiation source operable to deliver radiation to a lithographic apparatus for projection as a band of radiation on to a substrate while there is relative motion between the substrate and the radiation at a scan speed $v_s$. The method involves the calculation of a quantity that is a measure of the contribution to an energy dose delivered to a position on the substrate W that arises from the dither modulation for a range of frequencies, and the selection of a frequency that minimizes the quantity. The contribution to the energy dose is calculated as a convolution of: a profile of the band of radiation, and an irradiance delivered by the radiation source, as, e.g., given by Eq. 11.

The method may be performed for one or more sets of system parameters such as: the time taken for the band of radiation to sweep past the position on the substrate; the size and shape of the slit profile; the scan speed $v_s$; the pulse frequency $f_p$; and/or the number of pulses that contribute to an energy dose.

Furthermore, since, as explained above, in general the contribution to the energy dose that arises from the dither modulation will vary for different points on the substrate, the method may be performed for more than one position on the substrate. For such embodiments, the method may use a worst case scenario to ensure that the contribution to energy dose for all points on the substrate is below some certain (e.g., predetermined) level.

Figure 5:
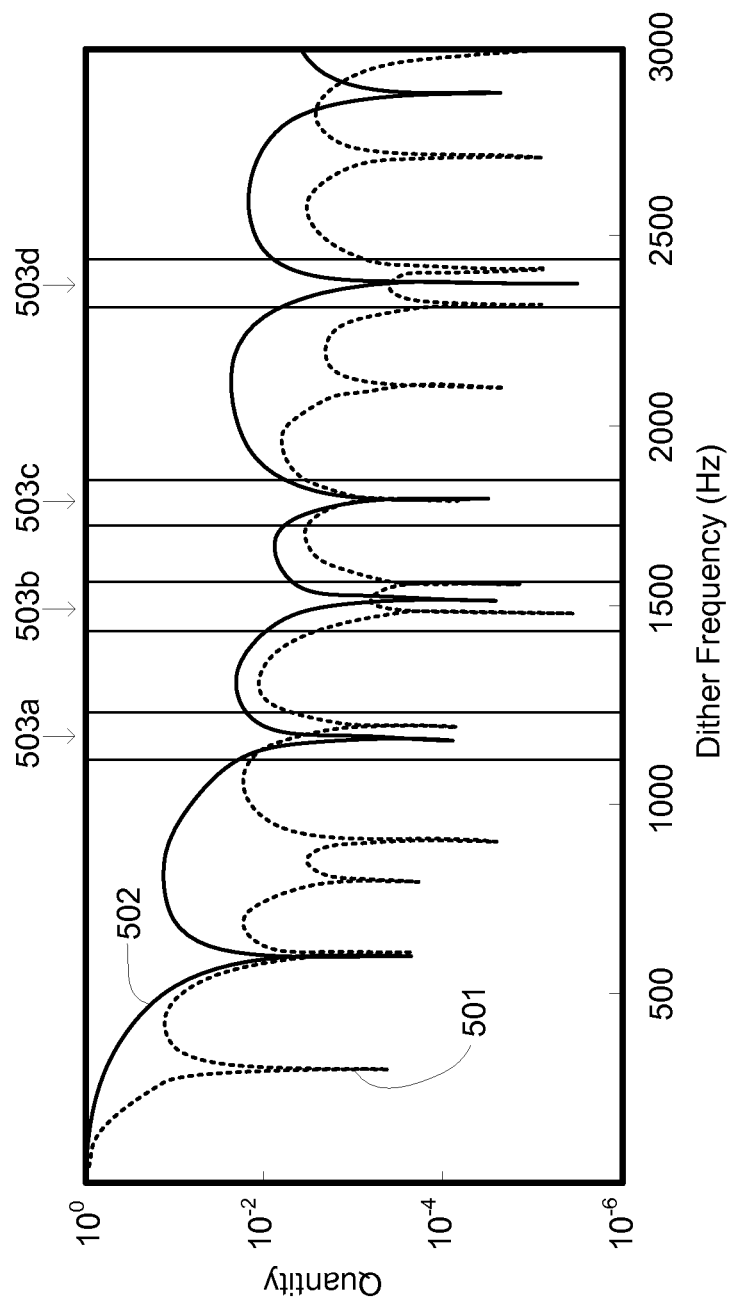
FIG. 5 is a schematic graph of a quantity that is a measure of the contribution to an energy dose delivered to the position that arises from an applied dither modulation as a function of dither frequency.

FIG. 5 is a schematic graph of a quantity that is a measure of the contribution to an energy dose delivered to a position on the substrate W that arises from the dither modulation as a function of the frequency of the dither modulation. The graph in FIG. 5 was calculated using the radiation profile shown in FIG. 2a. The calculation was performed using MatLab although other software programs may be used as desired or required. The quantity shown is the ratio of the relative size of the modulation in dose expressed as a percentage of the dose which would have been received had no dither been applied, to the relative size of the modulation that was applied to the variable of the radiation source expressed as a percentage of that variable without the modulation. This may be paraphrased as the size of the dose modulation relative to the size of the modulation applied to the radiation source. The quantity has been calculated for first and second ratios of the scan speed $v_s$ to the pulse frequency $f_p$, lines 501 and 502 respectively. Line 501 represents a scan speed $v_s$ of 0.2 m/s and a pulse frequency $f_p$ of 2 kHz whereas line 502 represents a scan speed $v_s$ of 0.39 m/s and a pulse frequency $f_p$ of 2 kHz. Frequency ranges 503a-d, represent frequencies at which the quantity is considerably reduced for both the first and the second ratios of scan speed $v_s$ to pulse frequency $f_p$.

A lithographic apparatus may be operated at different ratios of scan speed $v_s$ to pulse frequency $f_p$. For example, a lithographic apparatus may expose a first batch of substrates W at the first ratio and a second batch of substrates W at the second ratio. A dither modulation frequency may be selected from the frequency ranges 503a-d in order to help ensure that the quantity is at an acceptable level during exposure of the first and second batches of substrates W, at both the first and the second ratios. The acceptable level may for example be a level which satisfies a certain (e.g., predetermined) criteria. The criteria may, for example, be that dose variation caused by the modulation is below a threshold value.

In general a lithographic apparatus may be operated with a range of values of system parameters, such as scan speed $v_s$ and pulse frequency $f_p$. The quantity as a function of dither modulation frequency may be calculated for every combination of values of the system parameters at which the lithographic apparatus is expected to operate. A frequency range may then be found at which the quantity is at an acceptable level for all of these combinations and a dither modulation frequency within this range may be chosen. The chosen dither modulation frequency may then be used during a calibration process during operation of the lithographic apparatus.

In an embodiment, the dither modulation frequency may be changed for different sets of system parameters (for example, different ratios of the scan speeds $v_s$ to the pulse frequency $f_p$). The dither modulation frequency may be changed in order to reduce the quantity at the set of system parameters at which the lithographic apparatus is operated (e.g. to select a frequency at which the quantity is at a minimum). For example, a first dither modulation frequency may be used while a first batch of substrates W are exposed and the lithographic apparatus is operated at a first ratio of the scan speed $v_s$ to pulse frequency $f_p$. The first dither modulation frequency may be a dither modulation frequency which reduces the quantity while operating the lithographic apparatus at the first ratio of the scan speed $v_s$ to pulse frequency $f_p$. The dither modulation frequency may be changed to a second dither modulation frequency to expose a second batch of substrates W with the lithographic apparatus being operated at a second ratio of the scan speed $v_s$ to pulse frequency $f_p$. The second dither modulation frequency may be a dither modulation frequency which reduces the quantity while operating the lithographic apparatus at the second ratio of scan speed $v_s$ to pulse frequency $f_p$.

While the radiation source SO has been described as comprising a laser, the radiation source SO may be any form of radiation source SO. For example the radiation source SO may be an EUV radiation source (e.g. a DPP source or an LPP source) or a lamp type radiation source (e.g. a mercury discharge lamp).

While specific embodiments of the invention have been described above, it will be appreciated that the invention may be practiced otherwise than as described. For example, the embodiments of the invention may take the form of a computer program containing one or more sequences of machine-readable instructions describing a method as disclosed above, or a data storage medium (e.g. semiconductor memory, magnetic or optical disk) having such a computer program stored therein. Further, the machine-readable instruction may be embodied in two or more computer programs. The two or more computer programs may be stored on one or more different memories and/or data storage media. The description is not intended to limit the invention.

The invention claimed is:

1. A method of selecting a periodic modulation to be applied to a variable of a radiation source, wherein the radiation source is operable to deliver radiation to a lithographic apparatus for projection as a band of radiation onto a substrate and wherein the lithographic apparatus is operable to provide relative motion between the substrate and the radiation at a scan speed, the method comprising:

for a set of system parameters and for a position on the substrate, calculating a quantity, the quantity being a measure of the contribution to an energy dose delivered to the position that arises from the modulation being applied to the variable of the radiation source, wherein the contribution to the energy dose is calculated as a convolution of: a profile of the band of radiation, and a contribution to an irradiance of radiation delivered by the radiation source; and selecting a frequency value of the modulation at which the quantity for the set of system parameters and the position on the substrate satisfies a certain criteria.

2. The method as claimed in claim 1, wherein the modulation is applied to an amplitude of an output power or irradiance of the radiation source.

3. The method as claimed in claim 1, wherein the radiation source has a variable that can be varied so as to vary an output power or irradiance of the radiation source and wherein the modulation is applied to the variable.

4. The method as claimed in claim 1, wherein the system parameters comprise a time taken for the band of radiation to sweep past a position on the substrate or a time taken for a position on the substrate to sweep past the band of radiation.

5. The method as claimed in claim 1, wherein the system parameters comprise a size and shape of the profile of the band of radiation.

6. The method as claimed in claim 1, wherein the system parameters comprise the scan speed.

7. The method as claimed in claim 1, wherein the system parameters comprise a phase of the modulation.

8. The method as claimed in claim 1, wherein the radiation produced by the radiation source is a pulsed radiation beam having a pulse frequency and wherein the system parameters comprise (i) the pulse frequency, (ii) a phase of the pulsed radiation beam, (iii) the number of pulses that contribute to an energy dose, (iv) a ratio of the scan speed to the pulse frequency, or (v) any combination selected from (i)-(iv).

9. The method as claimed in claim 1, wherein the quantity is the amplitude of a modulation in the energy dose received by the point on the substrate expressed as a percentage of an average energy dose.

10. The method as claimed in claim 1, wherein the quantity is proportional to the ratio of the contribution to an energy dose delivered to the position on the substrate that arises from the modulation to an energy dose that would be delivered to the position on the substrate if no modulation had been applied.

11. The method as claimed in claim 1, wherein the quantity is normalized by the amplitude of the modulation that is applied to a variable of the radiation source.

12. The method as claimed in claim 1, wherein the criteria requires the quantity to be below a certain threshold.

13. The method as claimed in claim 1, wherein the criteria requires the frequency of the modulation to be at a local minimum of the quantity or within a particular amount thereof.

14. The method as claimed in claim 1, wherein the modulation is applied to the variable of the radiation source while the band of radiation beam is being projected onto the substrate.

15. The method as claimed in claim 1, further comprising using the modulation that is applied to the variable of the radiation source to calibrate a lithographic apparatus.

16. The method as claimed in claim 15, wherein the calibration of the lithographic apparatus comprises measuring an irradiance of a radiation beam and comparing this to the value of the variable of a radiation source to which the modulation is applied.

17. The method as claimed in claim 16, wherein the irradiance of the beam of radiation is parameterized as a polynomial function of the variable of the radiation source and calibration of the lithographic apparatus involves determination of a value of a parameter of the polynomial function.

18. The method as claimed in claim 17, wherein the frequency of the modulation is chosen so that aliasing effects have a negligible effect on the determination of the parameter.

19. A method comprising:

measuring irradiance of a radiation beam produced by a radiation source, the radiation source having a variable that can be varied so as to vary the output power or irradiance of the radiation source, wherein a periodic modulation is applied to the variable;

determining a relationship between the variable and the measured irradiance of the radiation beam;

controlling the value of the variable according to the determined relationship in order to control the irradiance of the radiation beam;

using a patterning device to impart the radiation beam with a pattern in its cross-section; and projecting the patterned radiation beam onto a target portion of a substrate as a band of radiation, wherein the frequency of the periodic modulation is selected according to claim 1.

20. A lithographic apparatus comprising:

a controller configured to output a control signal to a radiation source, wherein the control signal controls the value of a variable of the radiation source and wherein a modulation is applied to the control signal;

a radiation sensor configured to measure the irradiance of a radiation beam produced by the radiation source;

a substrate table configured to hold a substrate; and a projection system configured to project the radiation beam as a band of radiation onto a target portion of the substrate, wherein the controller is further configured to:

calculate a relationship between the variable of the radiation source and the irradiance of the radiation beam, wherein the calculation comprises, for a set of system parameters and for a position on the substrate, calculation of a quantity, the quantity being a measure of the contribution to an energy dose delivered to the position that arises from the modulation being applied, wherein the contribution to the energy dose is calculated as a convolution of: a profile of the band of radiation, and a contribution to an irradiance of radiation delivered by the radiation source, and control the control signal according to the calculated relationship in order to control the irradiance of the radiation beam, wherein the control comprises selection of a frequency value for the modulation at which the quantity for the set of system parameters and the position on the substrate satisfies a certain criteria.

* * * * *